United States Patent [19]

Kaufman et al.

[11] Patent Number: 5,157,330
[45] Date of Patent: Oct. 20, 1992

[54] METHOD AND APPARATUS FOR COMPENSATING MAGNETIC FIELD INHOMOGENEITY ARTIFACT IN MRI

[75] Inventors: Leon Kaufman, San Francisco; Joseph W. Carlson, Kensington; David M. Kramer, San Rafael; James D. Hale, Berkeley; Kingman Yee, San Francisco, all of Calif.

[73] Assignee: The Regents of the University of California, Oakland, Calif.

[21] Appl. No.: 659,181

[22] Filed: Feb. 22, 1991

[51] Int. Cl.$^5$ ............................................. G01R 33/20
[52] U.S. Cl. ...................................... 324/320; 324/318
[58] Field of Search ................ 364/413; 324/300, 307, 324/309, 312, 318, 319, 320, 322; 128/653 SC

[56] References Cited

U.S. PATENT DOCUMENTS

| | | | |
|---|---|---|---|
| 4,797,616 | 1/1989 | Matsui et al. | 324/309 |
| 4,818,942 | 4/1989 | Rzedzian | 324/312 |
| 4,855,910 | 8/1989 | Bohning | 364/413 |
| 4,857,843 | 8/1989 | Macovski | 324/307 |
| 4,876,508 | 10/1989 | Taylor | 324/309 |
| 4,940,941 | 7/1990 | Rzedzian | 324/312 |

Primary Examiner—Michael J. Tokar
Attorney, Agent, or Firm—Nixon & Vanderhye

[57] ABSTRACT

A measure of magnetic field inhomogeneity along a phase-encoded (e.g. y-axis) dimension is derived in k-space from previously acquired MRI phase-encoded projection data. From this, a measure of MRI data skewing caused by such inhomogeneity is obtained and used to compensate therefor. Since the MRI data is to be multi-dimensionally Fourier Transformed in most instances anyway, a transform in the relevant phase encoded dimension (e.g., y-axis) is taken followed with phase shifting each digitized data point by an amount proportional to the measured magnitude of inhomogeneity and to the datum coordinate in the read-out dimension (e.g., x-axis) and to the datum coordinate in each phase-encode dimension (e.g., y-axis) before the data is further Fourier Transformed with respect to the read-out dimension (e.g., x-axis). If two-dimensional phase encoding is employed (e.g., as in 3DFT), then a second level of similar inhomogeneity compensation can be had in the third dimension (e.g., z-axis) as well.

27 Claims, 8 Drawing Sheets

METHOD AND APPARATUS FOR COMPENSATING MAGNETIC FIELD INHOMOGENEITY ARTIFACT IN MRI

This invention relates generally to magnetic resonance imaging (MRI), chemical shift or spectroscopic imaging (CSI) or similar non-invasive imaging techniques using nuclear magnetic resonance (NMR) phenomena. Such NMR-based imaging procedures are collectively herein referred to as simply "MRI." In particular, the invention provides method and apparatus for compensating artifact in images made from acquired NMR data which are skewed in k-space because of inhomogeneity in the nominally "static" background magnetic field. The inhomogeneities best compensated are gradients in the background magnetic field with respect to phase-encoded dimensions in 2DFT or 3DFT image reconstruction processes.

Magnetic resonance imaging is by now a well-known and readily available technique for obtaining images of NMR nuclei populations internal to living human and/or animal anatomy. Even CSI is now beginning to come out of the laboratory and into commercial practice (e.g., providing an ability to image NMR nuclear populations for nuclear species other than hydrogen). All currently available imaging systems based upon NMR phenomena require a relatively large, nominally static, background field $B_0$ that is as close to homogeneous as possible. Inhomogeneities in this background field are known to produce artifact in the resulting visual images and various steps have been taken in the past to reduce such inhomogeneities, to compensate therefore, and/or to otherwise remove related artifact from the visual image. For example, the following prior approaches are generally related:

U.S. Pat. No. 4,885,542 — Yao et al (1989)
U.S. Pat. No. 4,970,457 — Kaufman et al (1990)
O'Donnell et al, "NMR Imaging in the Presence of Magnetic Field Inhomogeneities and Gradient Field Non-linearities," Med. Phys., Vol. 12 (1), Jan/Feb 1985, pp 20–26.
Dewhurst et al, "Correction for Magnetic Field Inhomogeneity", Book of Abstracts, Magn. Reson, Med., 1 : 199–200 (1985).

The Yao et al and Kaufman et al patents are commonly assigned with the present application. They teach techniques for generating MRI data having frequency and/or phase corrections in compensation for magnetic field inhomogeneities using calibration data derived from an extra measurement cycle taken without applied gradient fields. O'Donnell et al propose a technique for shifting image data in the spatial domain to compensate for magnetic field inhomogeneities. Nevertheless, improved compensation for magnetic field inhomogeneity artifact in MRI images remains a worthwhile and sought after goal in the industry.

A major cause of distortion in the MRI image is inhomogeneity in the static background field within the imaging volume. Such inhomogeneity can be produced from a variety of causes, such as, for example:

1. The earth's local magnetic field as modified by the local environment (e.g., by large ferromagnetic masses in the vicinity, large electrical current conductors in the vicinity, etc);
2. residual static gradient fields produced by DC components in gradient coil amplifier outputs; and
3. changes in magnetic field homogeneity produced by the past history of applied magnetic field gradient pulses (e.g., as caused by hysteresis effects and the like).

While the first two mentioned examples typically cause a truly static contribution to inhomegeneity, the last is more complicated and may result in a "static" background inhomoegeneity that varies during the course of a given single MRI data acquisition scan. Although this invention may be of greatest utility with respect to truly static inhomogeneities, it is also believed useful with respect to changes in inhomogeneity such as those associated with the third example of causes noted above.

Perhaps the most readily visible magnetic field inhomogeneity artifact in an MRI image is shearing distortion in the image. That is, a square object as depicted on the left-side of FIG. 2 may appear in an NMR image to be of parallelogram shape as depicted on the right-hand side of FIG. 2. In effect, the edges of the object in the read-out direction (e.g., the x-axis dimension) are not all aligned with respect to one another in the phase-encoded dimension (e.g., the y-axis).

As schematically depicted in FIG. 2, the dominant source of distortion in the image appears to be the component of background gradient $g_y$ in the phase-encoded direction y (e.g., a non-zero slope with respect to the y-axis as depicted by a solid line plot at the center portion of FIG. 2). Magnetic field inhomogeneity components in other directions (e.g., $g_x$ and $g_z$) also affect the image but in much less noticeable ways. For example, a constant gradient inhomogeneity component $g_x$ in the read-out (e.g., x-axis) direction alters scan resolution and may make a square object appear somewhat rectangular — but it does not otherwise visually distort the shape of the object. A constant gradient inhomogeneity $g_z$ in the slice selection (e.g., z-axis) direction will contribute signal loss during data acquisition and therefore to a change in the effective slice thickness — but not typically to a perceptible change in image shape.

It would be very desirable if one could somehow compensate the acquired MRI data so as to cancel the shearing artifact effects depicted in FIG. 2 that may otherwise occur due to inhomogeneities along the phase-encoding dimension. Of course, such compensation techniques should not prevent depiction of objects having any arbitrary shape (including parallelogram shapes) since the true object shape may well be of any arbitrary configuration. If one could somehow extract information from the acquired MRI data itself so as to measure the magnetic field inhomogeneity and then use such derived information to correct the final image during subsequent data processing procedures, this would be especially useful.

We have now discovered just such a technique. That is, we have discovered a way to use acquired MRI projection data in k-space to generate and effect corrections that will effectively compensate for shearing artifact of the type schematically depicted in FIG. 2.

We have discovered, for example, that an effective measure of the k-space data skewing (i.e., shearing) artifact can be derived by analysis of MRI data itself in k-space. In particular, deviation of the absolute maximum signal response from the nominally expected zero phase-encoding projection position in k-space (for either gradient echo MRI data or true spin echo data that has been "mis-adjusted" to effectively delay it by the use of extra gradient pulses) can be used to derive a measure of data skewing which, if left intact, will ultimately give rise to shearing artifact in the processed image.

Once the magnitude of such skewing has been measured in k-space (using either data specially acquired for just this purpose or data that is to be ultimately processed into image format), the unwanted skewing effect can be reversed by appropriate data shifting before or during normal image processing procedures.

Since appropriate data shifting in the k-space time domain is very difficult to perform accurately (where accurate interpolation of both phase and amplitude must be made on rapidly varying NMR signal responses), one possible technique is to Fourier Transform the data and then to perform an appropriate phase shift before the transformed and phase-shifted data is inverse transformed to achieve properly shifted and interpolated data back in the original domain. However, since NMR image processing procedures typically already include multi-dimensional Fourier Transformation, the de-skewing data phase shifts can most conveniently be made after the first dimension of Fourier Transformation — and without any need to then inverse transform before proceeding with subsequent dimensions of Fourier Transformation in accordance with usual image processing procedures.

Where variation in the relevant field inhomogeneity is expected during the course of the given data acquisition scan, suitable measurements of the skewing artifact can be made both before and after a given data acquisition scan. The de-skewing effect can then be calibrated to some interpolated value that better approximates the skewing artifact actually associated with central data projections in k-space (taken typically during the middle portion of a complete data acquisition scan).

If relatively constant "static" artifact effects are to be compensated, then measurement of the necessary de-skewing data may be effected relatively infrequently and used consistently thereafter for a given installation site. For example, if the k-space data in question comprises an array of 256×256 values, then the appropriate set of 256 phase shifts in k-space (one for each constant read-out coordinate dimension, i.e., along each data column extending in the y-dimension) may be retained in a suitable memory array and routinely applied as a part of the regular image processing procedures.

These as well as other objects and advantages of this invention will be better appreciated and more fully understood by carefully studying the following detailed description of presently preferred exemplary embodiments of this invention in conjunction with the accompanying drawings, of which:

Figure 1:
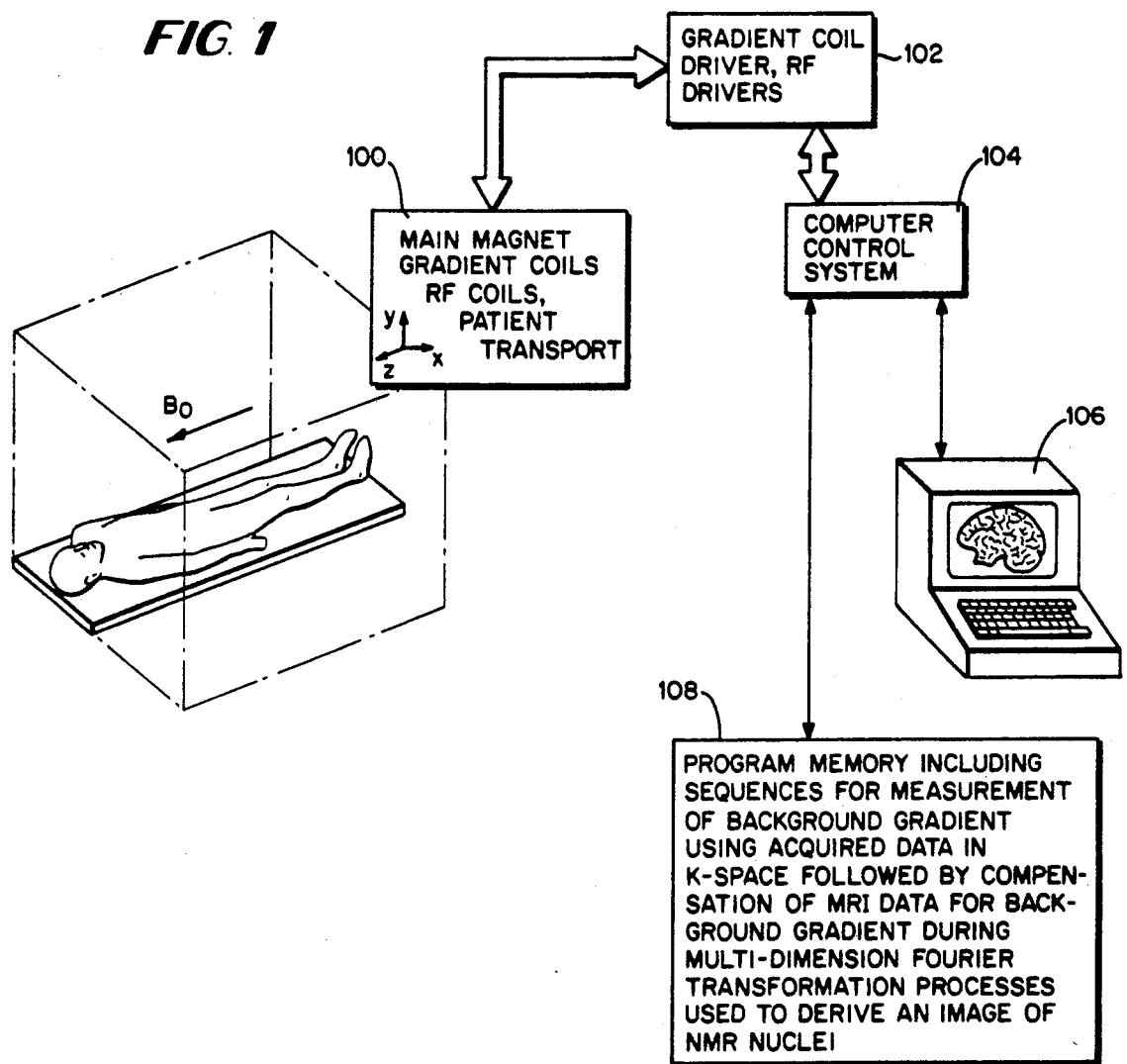
FIG. 1 is a schematic depiction of an MRI system including a program memory configured so as to appropriately measure background inhomogeneity gradients in k-space MRI data and to use such acquired data to compensate the same or other acquired MRI data for shearing artifacts that would otherwise be present in processed images.
Figure 9:
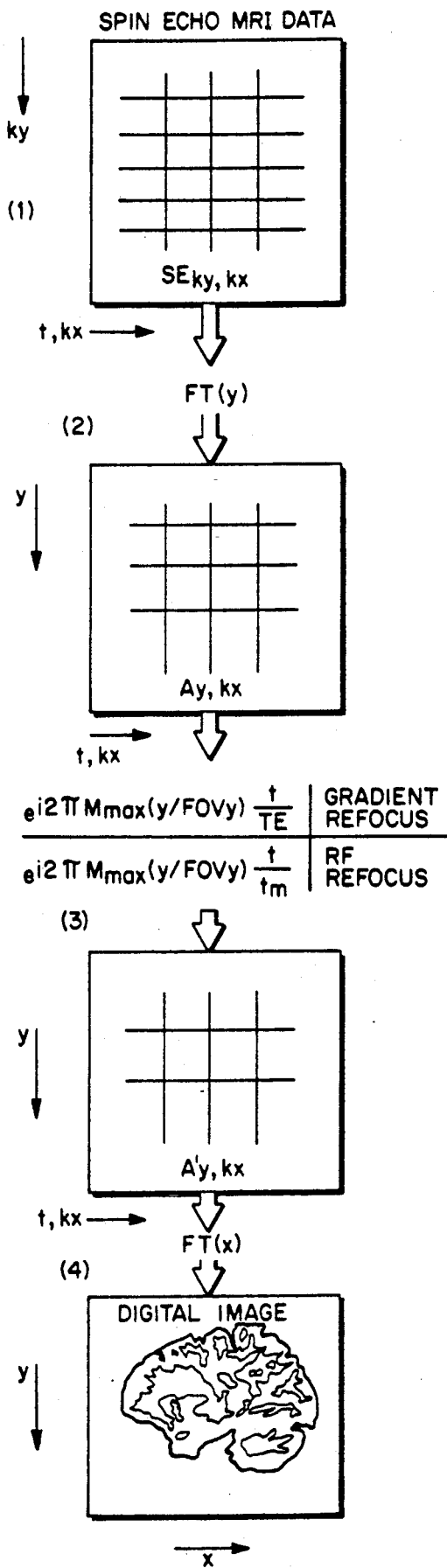
Figure 10:
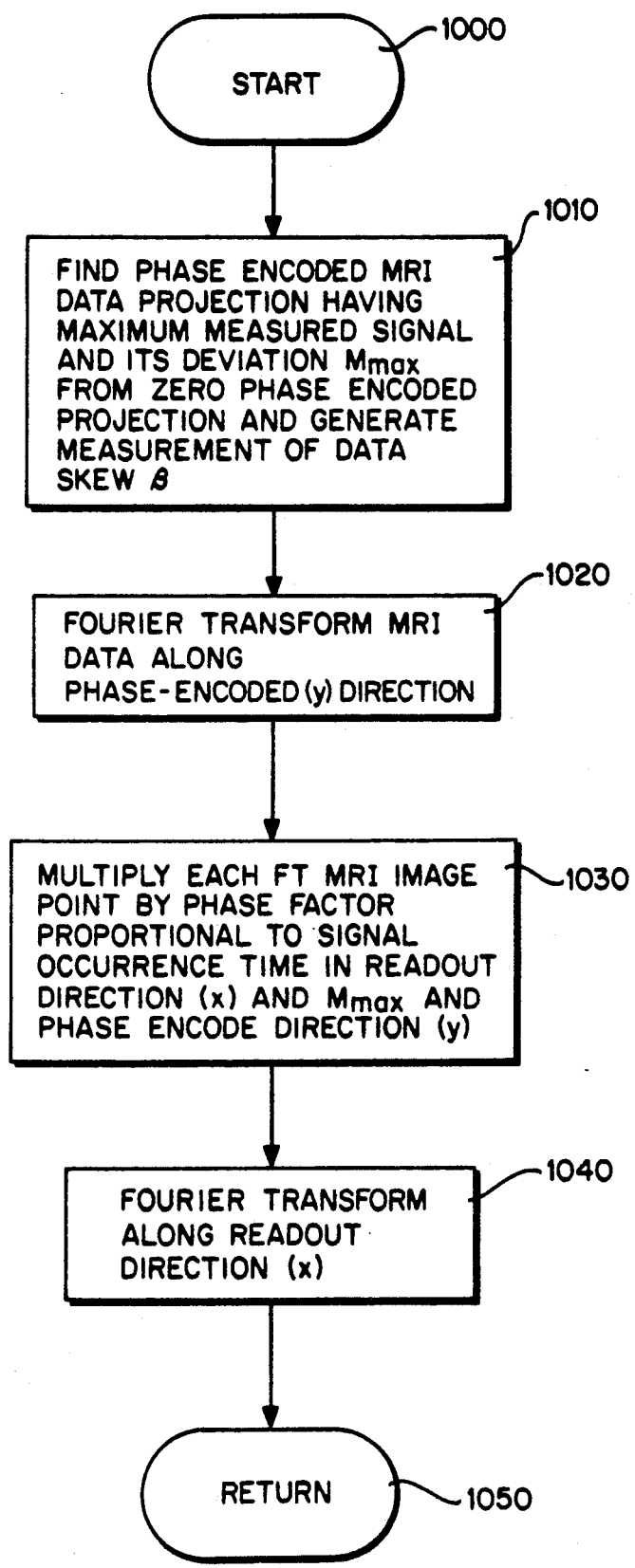
Figure 11:
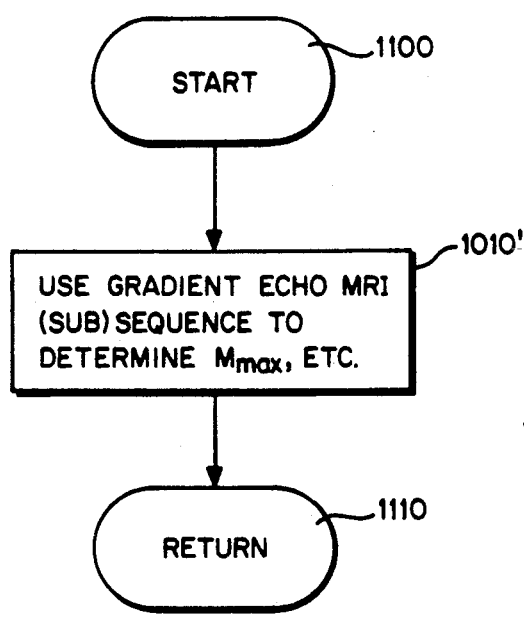
Figure 12:
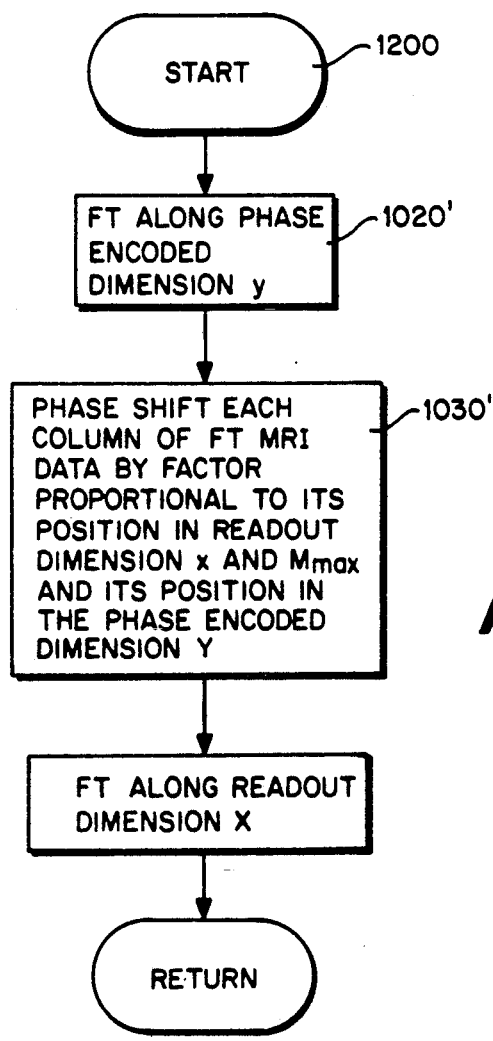

FIG. 9 is a schematic depiction of the digital matrix signal processing steps employed in the exemplary embodiment so as to de-skew acquired MRI data in conjunction with the usual multi-dimension Fourier Transformation image processing procedures; and FIGS. 10–12 are simplified flowcharts of suitable program subroutines that may be stored in the program memory of FIG. 1 so as to configure that system to implement exemplary embodiments of this invention.

As depicted in FIG. 1, the typical MRI system includes a main magnet assembly 100. Within the main magnet assembly 100, suitable permanent and/or electromagnet structures are included for generating a static background magnetic field $B_o$. In addition, the usual coils for generating substantially linear gradients in the background field along orthogonal x, y, z dimensions, RF transmit/receive coils and suitable patient transport mechanisms are employed as will be apparent to those in the art. Suitable circuitry for driving the gradient coils and RF coils is also included at 102 under control of suitable computer system 104. The computer system 104 is, in turn, ultimately controlled by an operator via terminal 106 and program memory 108. As will be appreciated by those in the art, the program memory may include either solid state silicon or magnetic media with recorded physical state changes representing programmed process control sequences (e.g., in executable "object code" formats). In this particular case, such sequences include control of (a) measurement of the background gradient and required de-skewing effect using acquired MRI data as well as (b) use of such acquired de-skewing data to compensate the same or other MRI data for background inhomogeneity gradients.

Figure 2:
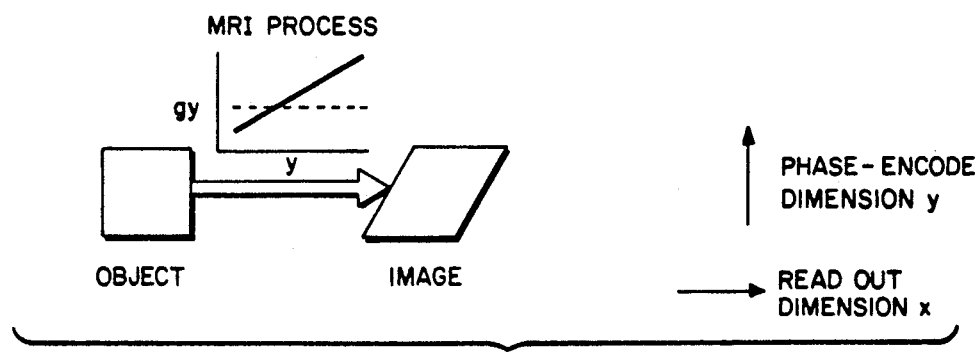
FIG. 2 is a schematic depiction illustrating shearing magnetic field inhomogeneity artifact along a phase-encoded dimension of the type best compensated by this invention.

As already briefly mentioned, if the background magnetic field component $g_y$ in a phase-encoded dimension y is not a constant homogeneous value (as indicated by a dotted line in the middle portion of FIG. 2) but, instead, includes a gradient along the phase encoding dimension y (as indicated by a solid line in graphical depiction at the center of FIG. 2), then a square object will be depicted with shearing artifact in the final image of the MRI system.

Figure 3:
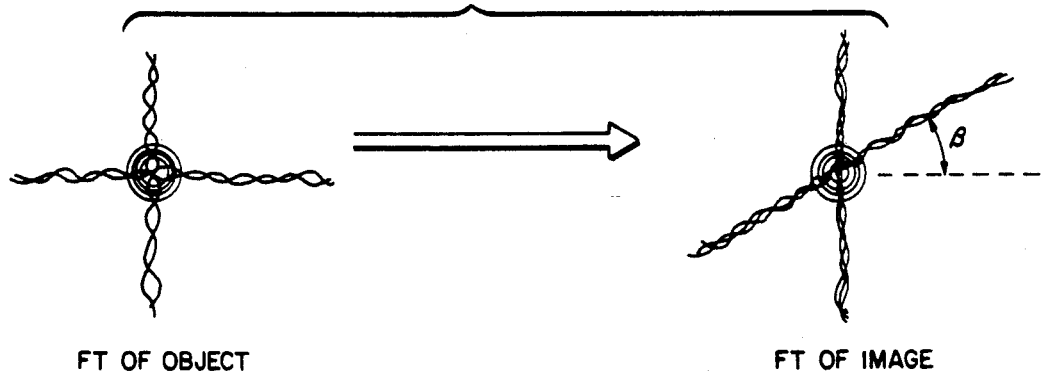
FIG. 3 is a schematic depiction in the Fourier Transform domain of the object and image depicted in FIG. 2.

The object and its skewed image are depicted in the Fourier Transform domain at FIG. 3. As there schematically depicted, the Fourier Transform domain of the image is skewed by angle $\beta$ from the desired or "correct" Fourier Transform of the object.

Figure 4:
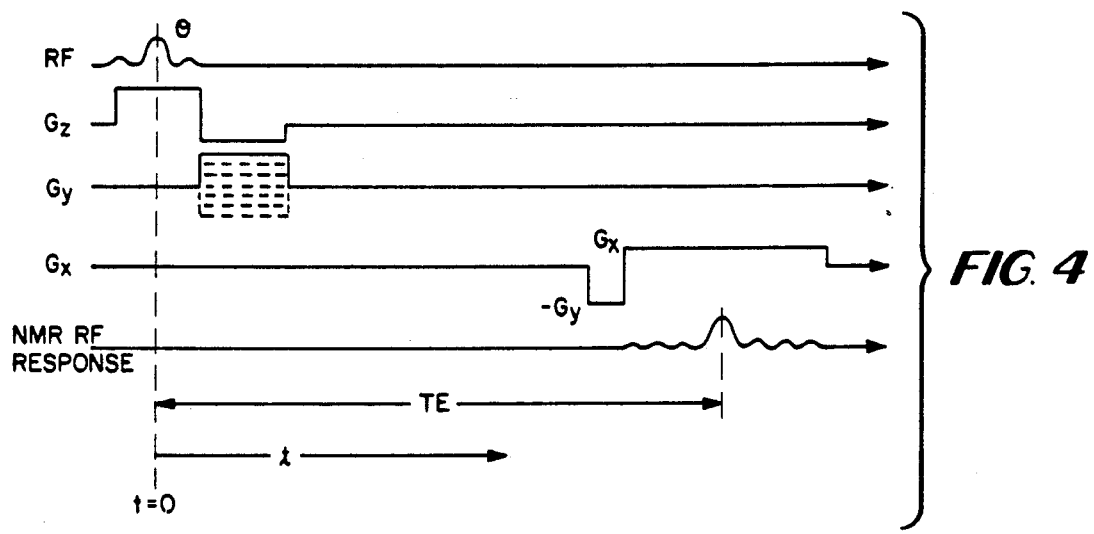
FIG. 4 is a schematic depiction of a typical gradient echo MRI data acquisition sequence.

To help understand the effects of magnetic field inhomogeneity along the phase-encoded dimension y — and our discovered technique for compensating same, it is useful to consider two different types of MRI data acquisition sequences. In FIG. 4, a gradient echo sequence is depicted. Here, at time t=0, an MRI RF nutation pulse $\theta$ is applied to a slice volume (selected by applied gradient $G_z$). A suitable value of phase-encoding magnetic gradient $G_y$ is also employed (typically a different value is used on each repetition of the sub-sequence actually depicted in FIG. 4). A reversed read-out gradient $-G_x$ then causes a gradient echo NMR RF response to occur at a subsequent time during a read-out window (defined by a positive read-out gradient $G_x$).

Figure 5:
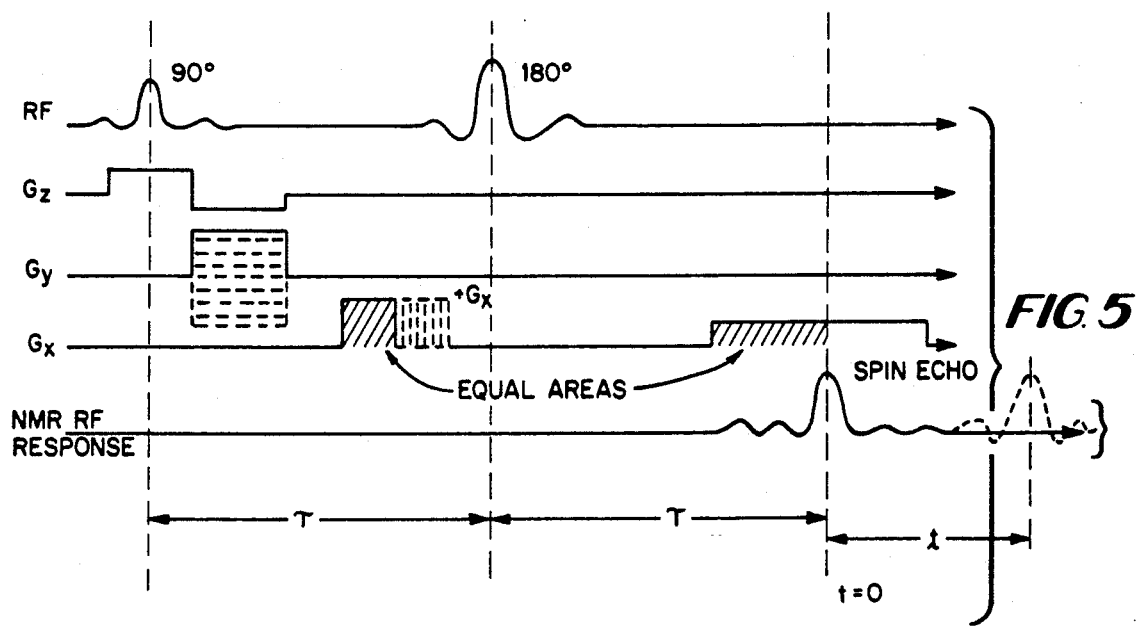
FIG. 5 is a schematic depiction of a typical spin echo MRI data acquisition sequence.

A spin echo MRI data acquisition cycle is schematically depicted at FIG. 5. Here, instead of a reversed read-out gradient $-G_x$, a 180° RF NMR nutation pulse is employed and a spin echo results in accordance with the rule of equal times as depicted in FIG. 5. Here, however, the effective "origin" of time (insofar as the spin echo signal response with respect to background inhomogeneities is concerned) is actually at the center of the spin echo signal itself. As depicted by dotted lines in FIG. 5, a longer $+G_x$ pulse may be employed to delay the spin echo signal response such that it occurs after the effective time origin where t=0. This will hereafter be referred to as a "mis-adjusted" spin echo MRI data acquisition sequence — and it may also be used to acquire de-skewing compensation data.

The effect of background inhomogeneity gradients is cumulative in a gradient echo MRI data acquisition sequence — and therefore somewhat easier to analyze. The effect of such an inhomogeneity gradient on the rotating NMR magnetization begins at the time of initial RF nutation (e.g., at the center the RF nutation pulse $\theta$ as depicted in FIG. 4) and causes decreased coherence throughout the sampling time. Indeed, as part of conventional imaging procedures, if a pulsed gradient field is applied for short time prior to sampling, and if its area (magnitude and duration) is properly adjusted, then it may produce some cancellation of unwanted background gradient effects.

For purposes of explanation, it may be assumed that a constant background inhomogeneity gradient in the phase-encoded y dimension produces at least two noticeable effects:

1. In k-space, the phase encoded projection exhibiting the maximum NMR RF signal response (overall two dimensions of k-space) is shifted away from the zero phase-encoded projection (where it normally would be expected in the absence of inhomogeneity). The amount of such shift is proportional to the static inhomogeneity gradient magnitude.

2. The data in k-space is skewed by an amount proportional to that inhomogeneity gradient thus causing a subsequent Fourier Transform of the data to be similarly skewed as depicted in FIG. 3 and to result in shearing artifact in the spatial domain image as depicted in FIG. 2.

Figure 6:
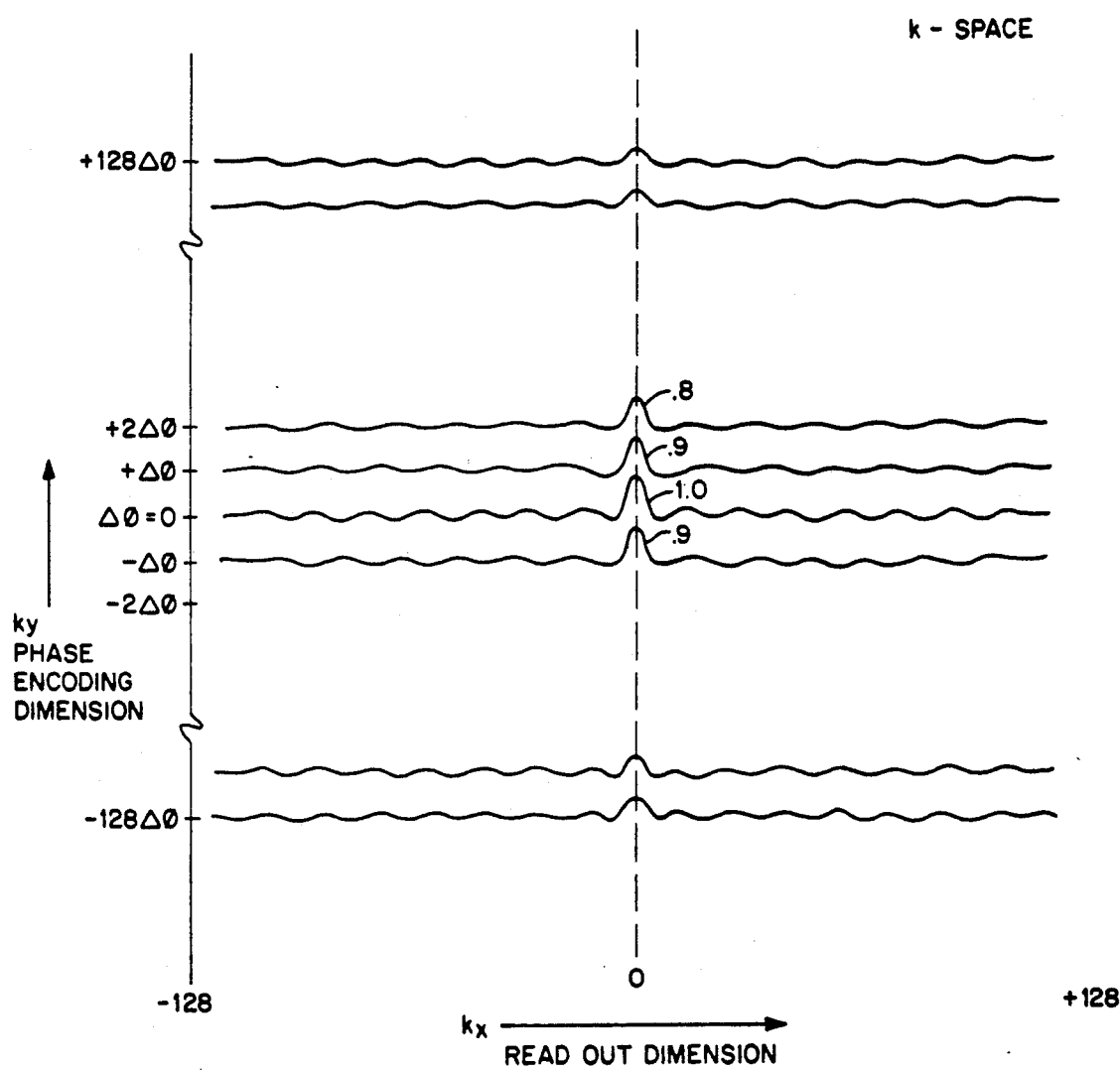
FIG. 6 is a schematic depiction of k-space MRI data as it might appear if there were no magnetic field inhomogeneities for gradient echo MRI data.

Assuming a typical 256×256 element array in k-space, the phase-encoded projection having maximum NMR RF signal strength (over all of k-space) would normally be expected at the central or zero phase-encoded projection as depicted in FIG. 6. That is, in normalized units of FIG. 6, the central zero phase encoded projection would have a maximum value of 1.0 while the phase-encoded projections of increasingly positive and negative phase-encoded values will have successively diminished normalized maximum values.

Figure 7:
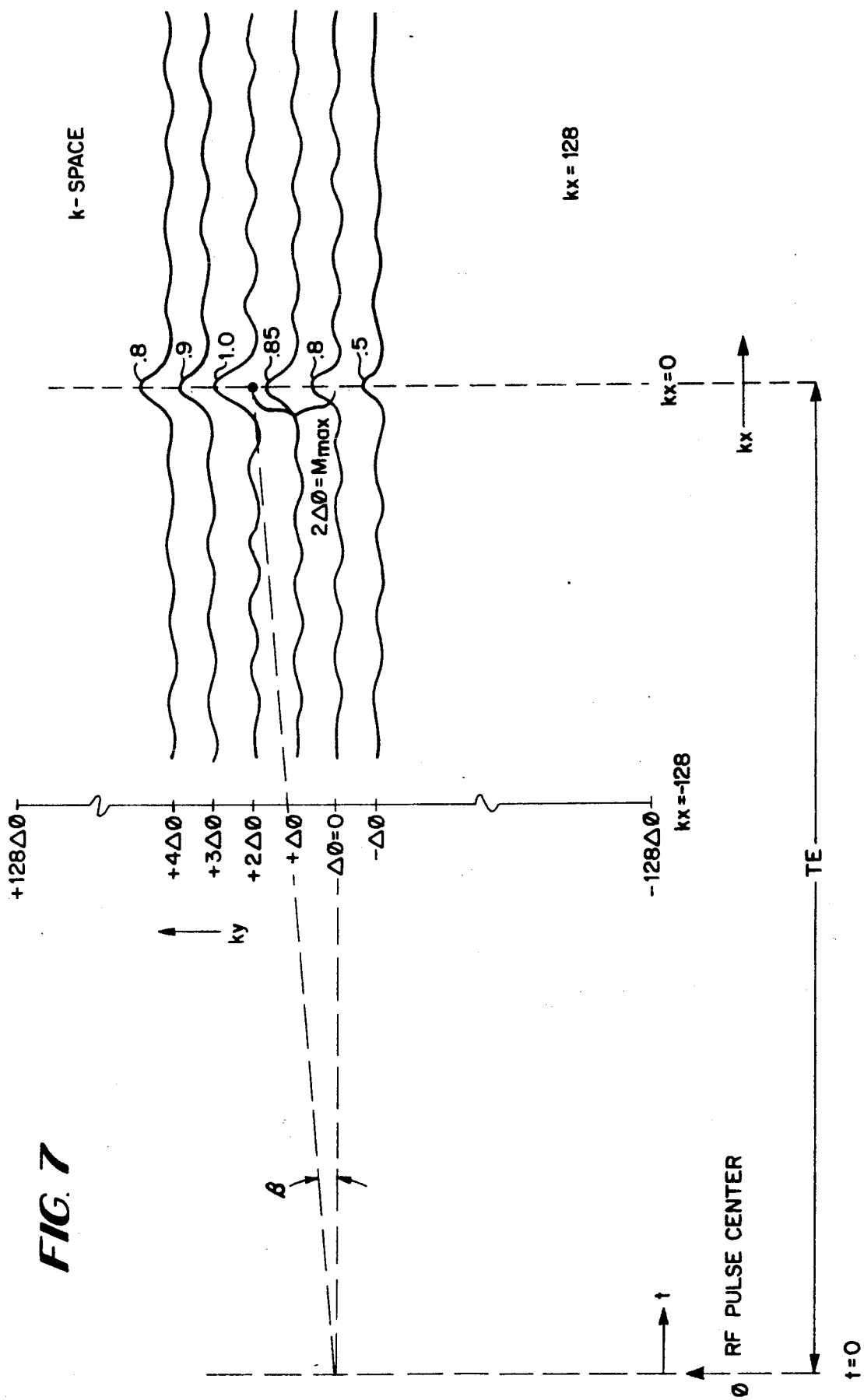
FIG. 7 is a partial depiction of k-space MRI data similar to that in FIG. 6 but depicting a change in the gradient echo data caused by magnetic field inhomogeneity gradient in the phase-encoded dimension and schematically depicting the skew angle $\beta$ associated with k-space data taken in the presence of such inhomogeneity.

However, where there is inhomogeneity gradient in the y axis phase-encoded dimension, then the phase-encoded projection exhibiting maximum NMR RF signal intensity will be shifted in k-space — e.g., as depicted in FIG. 7. In FIG. 7, for example, the normalized maximum 1.0 response occurs at $+2\Delta\phi$ phase encoding (e.g., corresponding to a two-pixel shift in k-space). As earlier mentioned, this artifact for gradient echo data is cumulative from the center of the perturbing RF nutation pulse. Accordingly, one can geometrically conceptualize the skewing angle $\beta$ as a function of the time-to-echo TE and the discernible shift in k-space of the phase encoded projection exhibiting maximum RF response intensity.

A measurement of the inhomogeneity gradient $g_y$ in the phase encode dimensions is represented by the following equation:

$$g_y = (M_{max})/(FOV_y \gamma TE) \quad (1)$$

Where $M_{max}$ is the pixel displacement of the phase-encoded projection exhibiting maximum signal response from its nominal zero phase-encoded position, where $FOV_y$ is the y dimension of the field of view in similar units (e.g., cm), $\gamma$ is the usual gyromagnetic constant and TE is the time to echo.

Of course a simple translational shift in the point of maximum signal strength in k-space is, by itself, of no importance to the usual MR image (e.g., which typically only displays NMR magnitude in the spatial domain after two or more dimensions of Fourier Transformation). However, the skewing of such data does produce shearing artifact as earlier mentioned.

As just demonstrated, since the projection with maximum RF signal strength can be detected and its relative position measured in k-space, this detectable data from k-space may be used to derive suitable correction data that can correct for the shearing artifact otherwise created by skewing of the data (such skewing being related to the angle $\beta$ which, in turn, is derivable from the measured shift in maximum signal position within k-space and other readily known or ascertainable parameters). Once the skew angle $\beta$ is ascertained, then the recorded data in k-space must be appropriately shifted in the phase-encoded dimension by an amount proportional to the inhomogeneity gradient magnitude and the elapsed time from the center of the RF nutation pulse (e.g., a function of the angle $\beta$). The amount of the required shift is given by Equations 2 and 3:

$$\tan(\beta) = (M_{max})/TE \quad (2)$$

Thus, if t is the running time along the read-out direction, the needed $\Delta$ shift for each column in k space is:

$$\Delta = \tan(\beta) t \quad (3)$$

In other words, the amount of the required shift is exactly the measured differential $M_{max}$ pixels for signals along the center column (e.g., where kx = o) of the gradient echo (i.e., t = TE). It changes linearly with respect to time (or read out kx dimension) in k-space, decreasing at earlier times and increasing at later times. For example, such relative changes and their relationship to the measured angle $\beta$ are graphically depicted in the further schematic depiction of FIG. 8 where a central portion of a digital signal matrix is depicted with digitized matrix values $A_{n,m}$ and where the required amount of shifting is schematically depicted by the linearly increasing length of solid arrows for given y-dimension columns of the MRI data with respect to increases in t (or kx).

While theoretically it may be possible to use time domain interpolation so as to apply the appropriate magnitude and phase shift values in complex time domain data matrices, such techniques are notoriously difficult to perform efficiently in this context. Accordingly, the more accepted and known technique for signal shifting involves Fourier Transformation, multiplication by appropriate phase ramp factors (e.g., in this case with linearly increasing phase ramp angles as a function of the y dimension) followed by an inverse Fourier Transformation so as to obtain the properly shifted data back in the original domain.

Equivalently, the theorem says that one can produce a shifted data function through a convolution with a delta function that is displaced from the origin by the amount of the desired shift. Thus for a finite function f(s) of extent $\lambda$ (which could be a column from the raw data matrix) represented by N Fourier coefficients at the usual grid points $s_k = \lambda k/N$ with k running from $-N/2$ to $N/2-1$, we write $f(s_k)$ as f(k), then $$f(k+\delta) = \Sigma F_n e^{2\pi i k n/N} \quad (4)$$

where $$F_n = F_n e^{2\pi i \Sigma n/N} \quad (5)$$

$$f(k) = \Sigma F_n e^{2\pi i k n/N} \quad (6)$$

and the $F_n$ are the Fourier coefficients and $\delta$ is the shift expressed in units of the index (pixels). The slope of the phase ramp spans $2\pi$ radians across the finite Fourier space for each pixel of shift.

Figure 8:
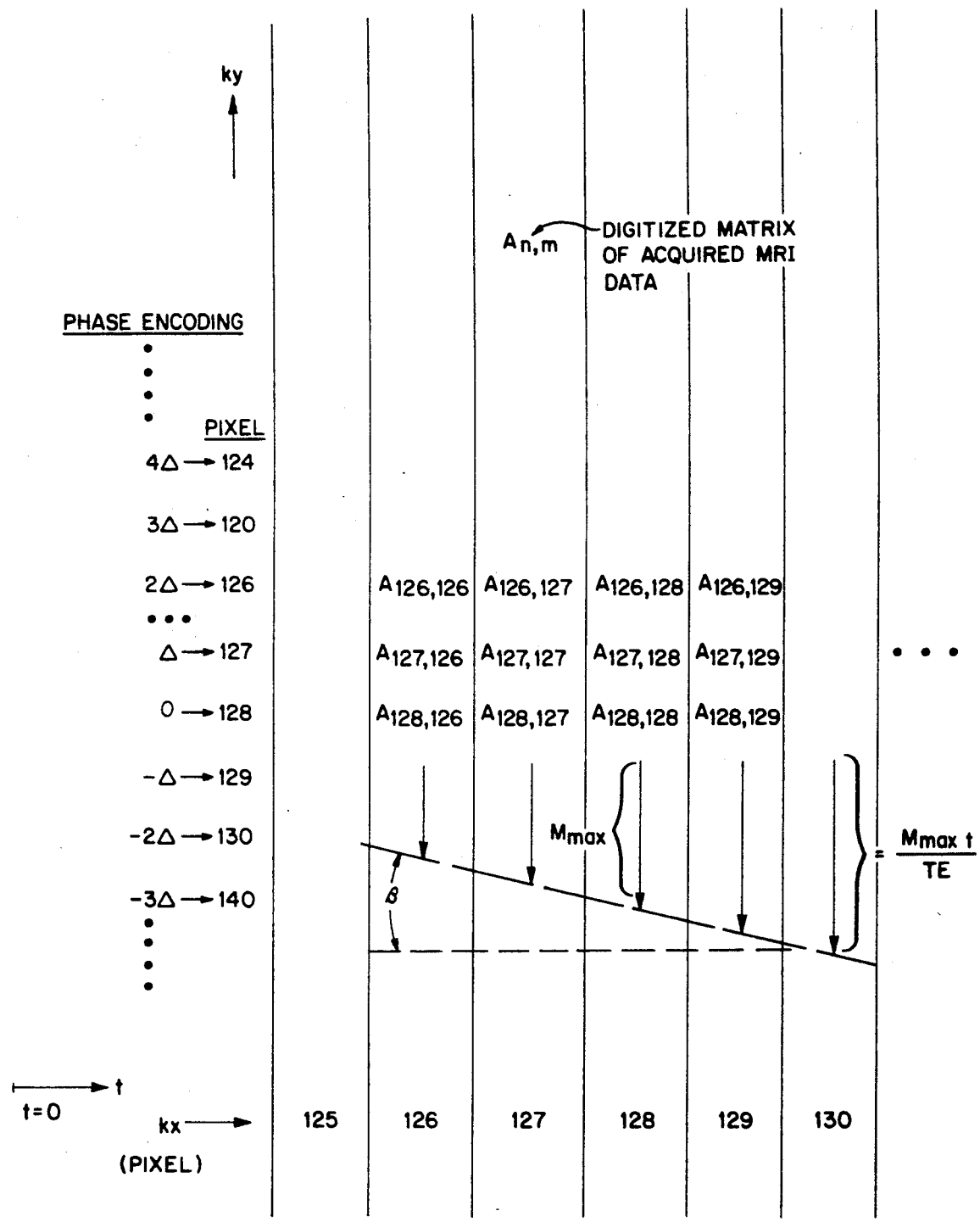
FIG. 8 is also a depiction of k-space MRI data (this time depicted in digital matrix format) including a schematic depiction of required data shifts proportional to measured inhomogeneity magnitude and to datum coordinates in the read-out dimension (i.e., transverse to the phase encoding dimension)

However, in the case of the preferred exemplary embodiment, this process can be somewhat simplified since the usual 2DFT and/or 3DFT MRI image processing procedure involves taking the Fourier Transform in the appropriate phase-encoded dimension anyway. Accordingly, the process can be simplified to the following:

1. Measure the inhomogeneity gradient along the phase-encoded direction in k-space using acquired MRI data (e.g., phase encoded gradient echo projections or phase encoded "mis-adjusted" spin echo projections);
2. Fourier Transform the acquired signals in k-space along the phase-encoded dimension y;
3. Multiply each column of Fourier Transformed coefficients by an appropriate phase ramp factor having a slope which is proportional to the relative time occurrence of the signal and the measured inhomogeneity gradient magnitude (i.e., a different phase ramp factor for each Fourier Transform column of coefficients as indicated in FIG. 8); and
4. Fourier Transform the resulting phase shifted coefficients with respect to the read-out direction (e.g., the x axis dimension) to produce digital image data that can be visually displayed (e.g., by modulating a raster scanned CRT beam in accordance with a synchronous readout of the resulting 2DFT coefficient magnitudes).

This general sequence of processes depicted schematically in FIG. 9 with parenthetical numerals (1)–(4) corresponding to the above enumerated steps 1-4 should now be apparent.

Suitable program subroutines for implementing exemplary embodiments of this invention are schematically depicted in the flowcharts of FIGS. 10-12. For example, in FIG. 10, a subroutine is entered at 1000 to process already acquired MRI projection data in k-space. At block 1010 a two-dimensional scan of k-space locates the absolute maximum magnitude RF signal and measures its deviation, if any, from the expected location at zero phase-encoding. Using other known installation and/or scan parameters, a measurement of data skew $\beta$ can be obtained (e.g., using the above-noted equations). Then, at 1020, the usual FT with respect to $k_y$ is performed followed at block 1030 by suitable column-by-column phase shifting of the transformed signals and at block 1040 by the usual second dimension FT with respect to $k_x$ before a return is executed at 1050.

Alternatively, a separate subroutine may be entered at 1100 and returned at 1110 as depicted in FIG. 11 to more infrequently execute step 1010' (substantially the same as step 1010 in FIG. 10) to determine fixed de-skewing data that is expected to stay relatively constant for several scans, for a whole day, month, etc., at a given installation. If this approach is used, then the separate subroutine of FIG. 12 (entered at 1200 and returned at 1210) can be used to implement image processing steps (including de-skewing) 1020', 1030' and 1040' which are substantially the same as steps 1020, 1030 and 1040 in FIG. 10.

The same procedure can be applied to more complicated data sets having multiple phase-encoded dimensions. For example, three dimensional imaging sequences sometimes use phase encoding in the slice dimension (e.g., z-axis) — as well as in the vertical y dimension. Such multiply phase-encoded dimensions simply require de-skewing corrections of the same type along each of the phase-encoded dimensions.

It is more complicated to analyze and derive correction factors for true spin echo image data using MRI data acquisition sequences of the type schematically depicted in FIG. 5. Here, the effective zero time (with respect to cumulative inhomogeneity gradient artifacts) begins at the center of the spin echo NMR RF response. Accordingly, in this case, the position of the signal maximum in k-space is not shifted. Nevertheless, the same skew (e.g., at angle $\beta$) in the data set is still present and must be compensated if the shearing artifact of FIG. 2 is to be avoided.

Accordingly, if spin echo MRI data is to be processed into images, the required measurement of inhomogeneity gradient along the phase-encoded dimension may be derived by acquiring a few extra phase-encoded projections using gradient echo sequences or "mis-adjusted" spin echo sequences (where the effective zero time is shifted with respect to the center of the spin echo RF signal by $t_{m(is\ adjustment)}$, shift of the maximum signal in k-space and a direct deduction of the skew angle of the spin echo data). Equation 2 is rewritten thus:

$$\tan(\beta) = (M_{max})/t_m \quad (7)$$

Since a few phase-encoded projections near the center of k-space can be rapidly achieved in practice, this would add little to the overall imaging time. Alternatively, one could use a previously measured inhomogeneity gradient magnitude (and skew angle data) obtained for a particular installation during a prior gradient echo sequence. Indeed, where the primary contributions to inhomogeneity are relatively static, the skew angle data may be measured (e.g., using gradient echo sequences) only relatively infrequently for a given installation and then used repeatedly to correct either gradient echo or spin echo MRI data during the usual image processing procedures.

Where the inhomogeneity gradient along a phase encoded dimension changes in time, a more complicated situation is presented. For example, such changes may be caused by external influences or by magnet hysteresis effects. In any event, it appears that the dominant distortion is still caused by the inhomogeneity gradient magnitude which exists during the time the central portion of k-space data is being acquired.

Of course, for gradient echo sequences, the actual inhomogeneity gradient magnitude can be directly measured for each set of acquired data in k-space (such measurement being effectively made during the time that the central k-space data is acquired since maximum signal strength will occur somewhere in those central projections of k-space).

For spin echo sequences, it should be possible to use gradient echo or "mis-adjusted" spin echo projections to measure the inhomogeneity gradient magnitude both immediately before and immediately after a given spin echo imaging sequence, followed by interpolation to estimate the inhomogeneity gradient that existed during the time that central projection data in k-space were being acquired.

Hysteresis effects in permanent magnet MRI systems present a second order problem. For example, if the phase encoding sequence starts at the top of k-space and progresses in sequence downwardly (i.e., starting with maximum positive phase encoding and moving towards zero and then in the negative direction towards ever larger negative phase encoding values), the magnet hysteresis should not change during the first half of the scan sequence. This is because each change in phase encoding gradient $G_y$ is being made in the same effective direction — that is the magnitude of each successive phase encoding gradient is less than the previous one. Accordingly, for this first or "top" half of k-space data acquisition, de-skewing corrections of the type already discussed in detail should compensate for shearing artifact — even if second order hysteresis effects are considered.

However, the second or "lower" half of k-space will effectively encounter a different skewing angle $\beta'$. This is because during the second half of such a data acquisition scan, the magnitude of the phase encoding gradient $-G_y$ is successively increasing in magnitude and second order hysteresis effects may now influence the effective inhomogeneity gradient magnitude (and hence the skew angle $\beta$). It is even possible that the skew angle $\beta$ will change as a function of position within the lower half of k-space. One possible solution to this problem is to acquire MRI data only for the first half of k-space — and then to use well-known complex conjugate symmetry relationships to create appropriate pseudo MRI data to fill in the entire lower half of k-space. Subsequent image processing could then be as previously described where it is assumed that a constant skew angle $\beta$ exists throughout k-space.

While we have only described a few exemplary embodiments of this invention in detail, those skilled in the art will appreciate that many modifications and variations may be made in these exemplary embodiments while yet retaining many of the novel features and advantages of this invention. Accordingly, all such variations and modifications are intended to be included within the scope of the appended claims.

What is claimed is:

1. A method for compensating magnetic field inhomogeneity artifact in MRI, said method comprising
   (a) measuring relative data skewing in k-space MRI data caused by a magnetic field gradient in a phase-encoded dimension; and
   (b) phase-shifting Fourier Transformed MRI data to compensate for said measured data skewing.

2. A method for compensating magnetic field inhomogeneity artifact in MRI, said method comprising:
   (a) measuring the relative magnitude of said inhomogeneity from MRI data in k-space;
   (b) transforming acquired multi-dimensional MRI data in k-space with respect to a first dimension representing a phase-encoded dimension;
   (c) phase-ramping the resulting transformed MRI data by an amount proportional to the magnitude of measured inhomogeneity in said phase-encoded dimension and to a MRI datum coordinate in a second dimension, transverse to said phase-encoded dimension; and
   (d) further transforming the resulting phase-shifted MRI data with respect to said second dimension.

3. A method as in claim 2 further comprising, after step (c):
   (c1) first transforming the phase-ramping MRI data with respect to a third dimension representing a further phase-encoded dimension; and
   (c2) further phase-ramping the resulting transformed MRI data from step (c1) by an amount proportional to the magnitude of measured inhomogeneity in a second phase-encoded dimension and to a MRI datum coordinate in said second phase-encoded dimension.

4. A method as in claim 1, 2 or 3 wherein said measuring step includes use of gradient echo MRI data.

5. A method as in claim 4 wherein less than a full set of gradient echo MRI data is acquired and used to determine magnetic field inhomogeneity.

6. A method as in claim 4 wherein said transforming and phase-ramping steps use spin echo MRI data.

7. A method as in claim 4 wherein said transforming and phase-ramping steps use gradient echo MRI data.

8. A method as in claim 2 or 3 wherein said transforming steps comprise Fourier Transformation.

9. A method for compensating magnetic field inhomogeneity artifact in MRI, said method including:
   acquiring multi-dimensional gradient echo MRI data in k-space;
   locating the maximum magnitude datum of said MRI data;
   detecting the dimensional shift, if any, in the location of said maximum from its expected location without magnetic field inhomogeneity as a measure of the magnitude of said inhomogeneity.

10. A method as in claim 9 wherein said acquiring, locating and detecting steps are performed both before and after acquisition of MRI data which is subsequently processed to produce a visual MR image, the before-acquisition and after-acquisition measures of inhomogeneity both being used to compensate for inhomogeneity artifact in said visual image.

11. A method as in claim 9 wherein said acquiring step includes acquisition of less than a full set of phase-encoded projections of MRI data in k-space.

12. A method as in claim 9 wherein said acquiring, locating and detecting steps use gradient echo MRI data and where the resulting measure of inhomogeneity magnitude is used to compensate artifact in spin echo MRI data.

13. A method as in claim 9 comprising:
Fourier Transforming acquired multi-dimensional MRI data with respect to a phase-encoded dimension y,
phase-ramping the thus transformed MRI data by an amount proportional to the inhomogeneity magnitude and to a read-out dimension x, transverse to said phase-encoded dimension y, and
Fourier Transforming the thus phase shifted MRI data with respect to said read-out dimension x.

14. A method as in claim 13 wherein:
the acquiring, locating and detecting steps are further performed to obtain a further measure of magnetic field inhomogeneity magnitude along a second phase-encoded dimension z; and
the phase-shifted MRI data are further Fourier Transformed with respect to the second phase-encoded dimension and further phase-ramped by an amount proportional to the z-dimension inhomogeneity magnitude and to elapsed time prior to said Fourier Transformation with respect to x.

15. A method for compensating magnetic field inhomogeneity along a phase encoded dimension y transverse to a read-out dimension x in a magnetic resonance imaging system which acquires MRI data generated subsequent to an RF nutation pulse occurrence, said method comprising the step of:
shifting acquired MRI data in the phase-encoded dimension y by an amount proportional to the magnitude of said magnetic field inhomogeneity and to elapsed time.

16. A method as in claim 15 further comprising the steps of:
measuring the magnitude of said magnetic field inhomogeneity by acquiring phase-encoded NMR RF data and determining what, if any, non-zero phase-encoding value is required to produce maximum NMR RF response magnitude.

17. A method as in claim 16 wherein said measuring step is performed using NMR gradient echo MRI data that is also subsequently used in said shifting step and to generate an image.

18. A method as in claim 15 or 16 wherein said MRI data is initially acquired as gradient echo MRI data.

19. A method as in claim 16 wherein said measuring step includes acquisition of phase-encoded MRI projection data using read-out gradient reversal while said shifting step is performed on spin echo MRI data produced by a succession of RF nutation pulses.

20. A method as in claim 16 wherein said measuring step includes acquisition of phase-encoded spin echo MRI projection data using mis-adjusted spin echo MRI data produced by a succession of RF nutation pulses and a delaying read-out gradient pulse.

21. A method as in claim 16 wherein said measuring step is performed both before and after-acquisition of the MRI data to be shifted and where said shifting step uses as field gradient magnitude a value interpolated from the values obtained by said before-acquisition and said after-acquisition measuring steps.

22. Apparatus for compensating magnetic field inhomogeneity artifact in MRI, said apparatus comprising:
(a) means for measuring relative data skewing in k-space MRI data caused by a magnetic field gradient in a phase-encoded dimension; and
(b) means for phase-shifting Fourier Transformed MRI data to compensate for said measured data skewing.

23. Apparatus for compensating magnetic field inhomogeneity artifact in MRI, said apparatus comprising:
(a) means for measuring the relative magnitude of said inhomogeneity from MRI data in k-space;
(b) means for transforming acquired multi-dimensional MRI data in k-space with respect to a first dimension representing a phase-encoded dimension;
(c) means for phase-ramping the resulting transformed MRI data by an amount proportional to the magnitude of measured inhomogeneity in said phase-encoded dimension and to a MRI datum coordinate in a second dimension, transverse to said phase-encoded dimension; and
(d) means for further transforming the resulting phase-shifted MRI data with respect to said second dimension.

24. Apparatus for compensating magnetic field inhomogeneity artifact in MRI, said apparatus including:
means for acquiring multi-dimensional gradient echo MRI data in k-space;
means for locating the maximum magnitude datum of said MRI data;
means for detecting the dimensional shift, if any, in the location of said maximum from its expected location without magnetic field inhomogeneity as a measure of the magnitude of said inhomogeneity.

25. Apparatus for compensating magnetic field inhomogeneity along a phase-encoded dimension y transverse to a read-out dimension x in a magnetic resonance imaging system which acquires MRI data generated subsequent to an RF nutation pulse occurrence, said apparatus comprising:
means for acquiring MRI data, and
means for shifting said acquired MRI data in the phase-encoded dimension y by an amount proportional to the magnitude of said magnetic field inhomogeneity and to elapsed time.

26. Apparatus as in claim 25 further comprising:
means for measuring the magnitude of said magnetic field inhomogeneity by acquiring phase-encoded NMR RF data and determining what, if any, non-zero phase-encoding value is required to produce maximum NMR RF response magnitude.

27. Apparatus as in claim 26 wherein said means for measuring includes means using NMR gradient echo MRI data that is also subsequently used in said means for shifting to generate an image.

* * * * *